United States Patent
Jung et al.

(10) Patent No.: US 7,799,622 B2
(45) Date of Patent: Sep. 21, 2010

(54) METHODS OF MANUFACTURING OXIDE SEMICONDUCTOR THIN FILM TRANSISTOR

(75) Inventors: Jisim Jung, Inchon (KR); Youngsoo Park, Yongin-si (KR); Sangyoon Lee, Seoul (KR); Changjung Kim, Yongin-si (KR); Taesang Kim, Seoul (KR); Jangyeon Kwon, Seongnam-si (KR); Kyungseok Son, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/320,627

(22) Filed: Jan. 30, 2009

(65) Prior Publication Data
US 2009/0305468 A1    Dec. 10, 2009

(30) Foreign Application Priority Data
Jun. 5, 2008   (KR) ............... 10-2008-0053128

(51) Int. Cl.
*H01L 21/00* (2006.01)

(52) U.S. Cl. ............ 438/151; 438/149; 438/154; 438/158; 438/166; 438/216; 438/268; 438/286; 257/E21.413

(58) Field of Classification Search ............... 438/214
See application file for complete search history.

(56) References Cited

U.S. PATENT DOCUMENTS

| 5,828,084 A | 10/1998 | Noguchi et al. | |
|---|---|---|---|
| 6,563,174 B2 * | 5/2003 | Kawasaki et al. | 257/350 |
| 6,980,268 B2 * | 12/2005 | You | 349/113 |
| 2003/0211668 A1 * | 11/2003 | Takatoku | 438/158 |

* cited by examiner

*Primary Examiner*—N Drew Richards
*Assistant Examiner*—Kyoung Lee
(74) *Attorney, Agent, or Firm*—Harness, Dickey & Pierce, P.L.C.

(57) ABSTRACT

Provided is a method of manufacturing an oxide semiconductor thin film transistor using a transparent oxide semiconductor as a material for a channel. The method of manufacturing the oxide semiconductor thin film transistor includes forming a passivation layer on a channel layer and performing an annealing process for one hour or more at a temperature of about 100° C. or above.

13 Claims, 8 Drawing Sheets

METHODS OF MANUFACTURING OXIDE SEMICONDUCTOR THIN FILM TRANSISTOR

PRIORITY STATEMENT

This application claims priority under 35 U.S.C. §119 to Korean Patent Application No. 10-2008-0053128, filed on Jun. 5, 2008, in the Korean Intellectual Property Office (KIPO), the entire contents of which are incorporated herein by reference.

BACKGROUND

1. Field

Example embodiments relate to a semiconductor thin film transistor, and more particularly, to a method of manufacturing oxide semiconductor thin film transistors using an oxide semiconductor as a material for the channel.

2. Description of the Related Art

Oxide semiconductor thin film transistors which use an oxide semiconductor as a material for the channel may be used, for example, in the panel of a display device, e.g. an active matrix liquid crystal display (AMLCD) or an active matrix organic light emitting device (AMOLED).

In the manufacture of oxide semiconductor thin film transistors, the channel layer may be damaged by a plasma or etchant during different process steps. For example, it may be damaged during the deposition of a metal thin film, used to form the source and drain electrodes, onto a channel layer, or during patterning of metal thin film. As a result, the thin film transistors may have unstable characteristics, e.g. non-uniform electrical characteristics and/or altered threshold voltages. The unstable characteristics of the thin film transistors make the use of the thin film transistors difficult, for example, in panel applications, e.g. in the operating device of a display.

SUMMARY

Example embodiments provide methods of manufacturing oxide semiconductor thin film transistors, where the methods are capable of improving the characteristics of such devices.

According to example embodiments, a method of manufacturing an oxide semiconductor thin film transistor may be provided, where the oxide semiconductor thin film transistor may use a transparent oxide semiconductor as the material for a channel, the method comprising, for example: forming a passivation layer on a channel layer and performing an annealing process for about one hour or more at a temperature of about 100° C. or above.

According to example embodiments, the annealing process may be performed for about 30-100 hours at a temperature of about 200-400° C. The annealing process may be performed, for example, in an air, oxygen, or nitrogen atmosphere.

According to example embodiments, the transparent oxide semiconductor may include one or more of Zinc Oxide, Tin Oxide, Ga—In—Zn Oxide, In—Zn Oxide, In—Sn Oxide, and one of these materials doped with Al, Ni, Cu, Ta, Hf, or Ti. The passivation layer may, for example, be formed of one or more of a silicon nitride film, silicon oxide film, and an organic insulation film.

According to example embodiments, a method of manufacturing an oxide semiconductor thin film transistor may be provided, the method comprising: forming a gate on a substrate and forming a gate insulation layer on the substrate to cover the gate; forming a transparent oxide semiconductor channel layer on the gate insulation layer; forming source and drain electrodes on both sides of the channel layer; forming a passivation layer to cover the source and drain electrodes and the channel layer; and performing an annealing process for one hour or more at a temperature of about 100° C. or above.

According to example embodiments, the method may include a process for supplying oxygen to the channel layer, for example a plasma process, after forming the source and drain electrodes.

According to example embodiments, the method may include forming an etch stop layer between the channel layer and the passivation layer. The etch stop layer may be formed of, for example, silicon oxide.

According to example embodiments, a method of manufacturing an oxide semiconductor thin film transistor may be provided, the method comprising, for example: forming a channel layer formed of a transparent oxide semiconductor on a substrate and forming a gate insulation layer on the substrate to cover the channel layer; forming a gate on the gate insulation layer and forming an inter-layer dielectric (ILD) layer on the gate insulation layer to cover the gate; forming source and drain electrodes to connect to portions of both ends of the channel layer on the ILD layer; forming a passivation layer to cover the ILD layer and the source and drain electrodes; and performing an annealing process for one hour or more at a temperature of about 100° C. or above.

According to example embodiments, the method may include forming a via hole in the ILD layer and the gate insulation layer for forming the source and drain electrodes after the forming of the ILD layer.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

FIG. 1 is a cross-sectional diagram of an oxide semiconductor thin film transistor according to example embodiments;

FIGS. 2 through 5 illustrate a method of manufacturing the oxide semiconductor thin film transistor of FIG. 1 according to example embodiments;

FIG. 6 is a graph showing the change in threshold voltage as a function of anneal time in an oxide semiconductor thin film transistor of FIG. 1 according to example embodiments;

FIG. 7 is a graph showing the change in threshold voltage as a function of anneal time due to a bias stress applied to the oxide semiconductor thin film transistor of FIG. 1 according to example embodiments;

FIG. 9-10 are cross-sectional diagrams of oxide semiconductor thin film transistor according to example embodiments.

Figure 1:
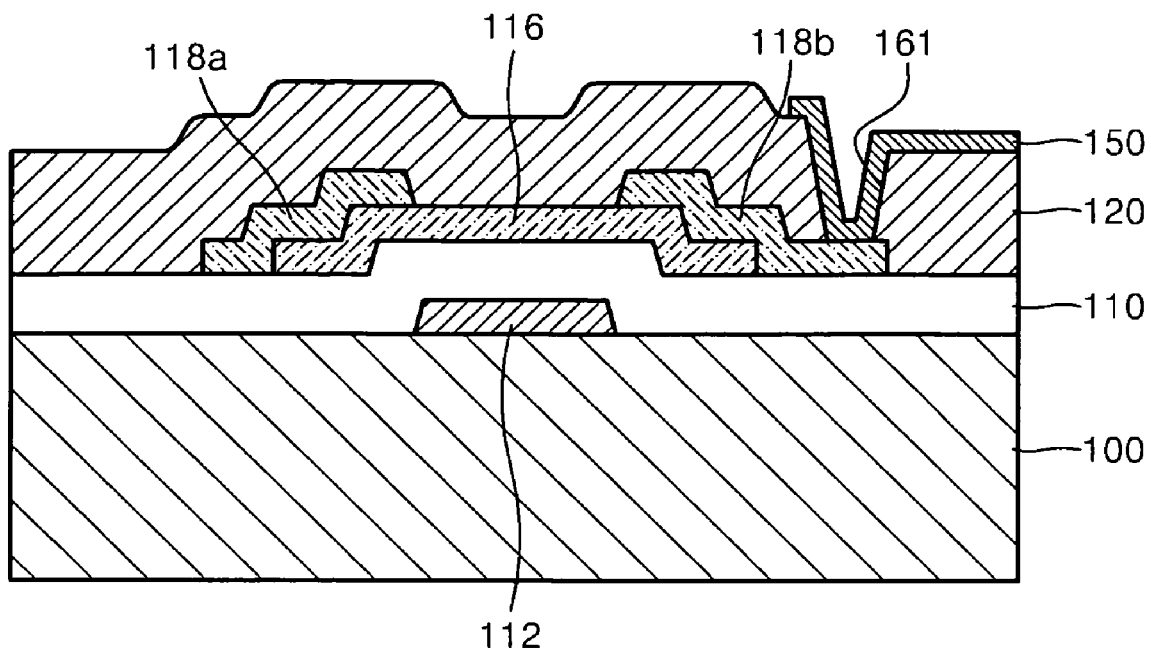

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram of an example oxide semiconductor thin film transistor that may be disposed on a pixel portion of a panel in a display device e.g. an active matrix liquid crystal display (AMLCD) or an active matrix organic light emitting device (AMOLED), according to example embodiments.

Referring to FIG. 1, the oxide semiconductor thin film transistor may include a gate 112, a gate insulation layer 110, a channel layer 116, source and drain electrodes 118a and 118b, and a passivation layer 120, that may be sequentially formed on a substrate 100. The gate 112 may be formed on the substrate 100 and the gate insulation layer 110 may be formed to cover the gate 112. The channel layer 116 may be formed on the gate insulation layer 110 disposed on the upper portion of the gate 112. The channel layer 116 may be formed of, for example, a transparent oxide semiconductor. Materials for forming the transparent oxide semiconductor may include, for example, one or more of Zinc Oxide, Tin Oxide, Ga—In—Zn Oxide, In—Zn Oxide, In—Sn Oxide, and one of these materials doped with Al, Ni, Cu, Ta, Hf, or Ti. However, the materials are examples and not limited thereto.

The source and drain electrodes 118a and 118b may be formed on either side of the channel layer 116. The passivation layer 120 may be formed on the gate insulation layer 110 to cover the source and drain electrodes 118a and 118b and the channel layer 116. The passivation layer 120 may be formed of, for example, one or more of a silicon nitride film, silicon oxide film, and/or an organic insulation film. A pixel electrode 150 may be formed on the passivation layer 120 of the oxide semiconductor thin film transistor, thereby forming a pixel portion of a display panel. The pixel electrode 150 may be electrically connected to the drain electrode 118b through a via hole 161 formed in the passivation layer 120. The pixel electrode 150 may be formed of a transparent conductive material, for example, Indium Tin Oxide (ITO) or Indium Zinc Oxide (IZO).

Figure 2:
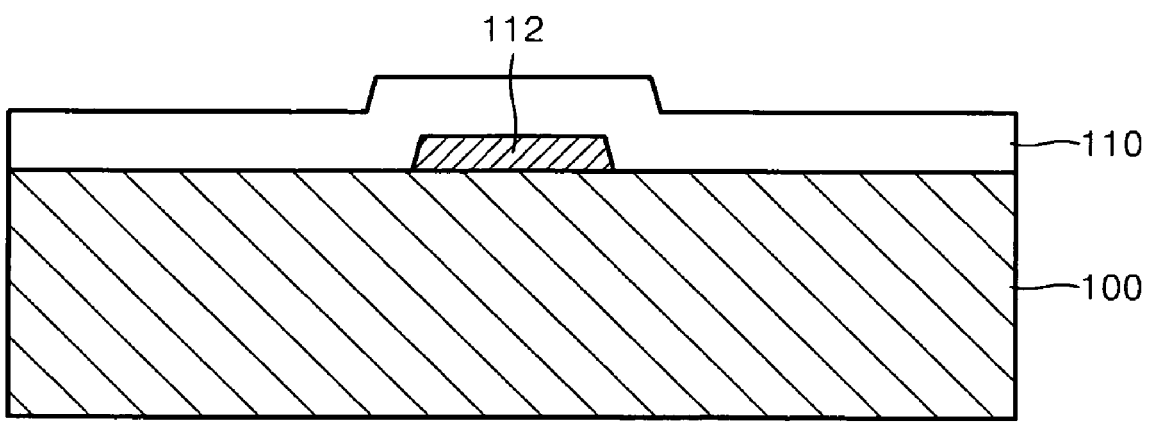

Example embodiments will now be described with reference to FIGS. 2 through 5, which may illustrate a method of manufacturing the oxide semiconductor thin film transistor of FIG. 1. Referring to FIG. 2, in example embodiments, the substrate 100 may be prepared and the gate 112 may be formed on the substrate 100. The substrate 100 may be formed of, for example, silicon. Other example embodiments may include a glass or a plastic substrate 100, or a combination of materials. The gate 112 may be formed by depositing a gate metal (for example, Mo) on the substrate 100 and patterning the deposited gate metal. The gate insulation layer 110 may be formed on the substrate 100 to cover the gate 112. The gate insulation layer 110 may be formed of, for example, silicon oxide or silicon nitride.

Figure 3:
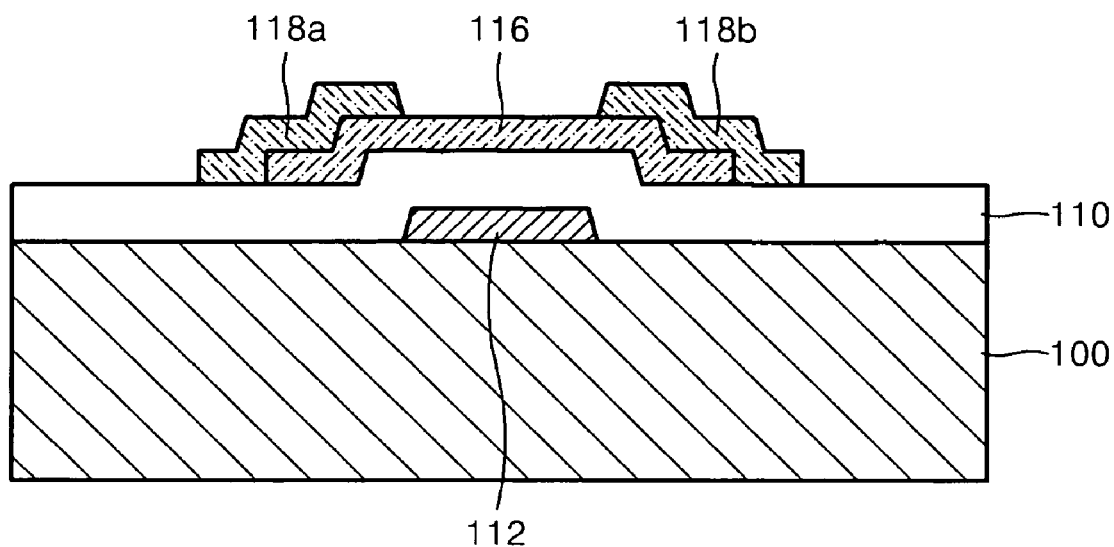

Referring to FIG. 3, the channel layer 116 may be formed on the gate insulation layer 110 to correspond to the gate 112. The channel layer 116 may be formed of a transparent oxide semiconductor. Materials for forming the transparent oxide semiconductor may include one or more of Zinc Oxide, Tin Oxide, Ga—In—Zn Oxide, In—Zn Oxide, In—Sn Oxide, and one of these materials doped with Al, Ni, Cu, Ta, Hf, or Ti. However, the materials are examples and not limited thereto. The channel layer 116 may be formed by depositing the oxide semiconductor described above on the gate insulation layer 110 and patterning the deposited oxide semiconductor.

The source and drain electrodes 118a and 118b may be formed on both sides of the channel layer 116. The source and drain electrodes 118a and 118b may be formed by forming a metal layer to cover the channel layer 116 and patterning the metal layer. The metal layer may have a single-layer structure or a multi-layer structure and may be formed of one or more materials selected, for example, from the group consisting of Cu, Mo, and Al. However, the described materials are examples and are not limited to this group or to metals.

Figure 4:
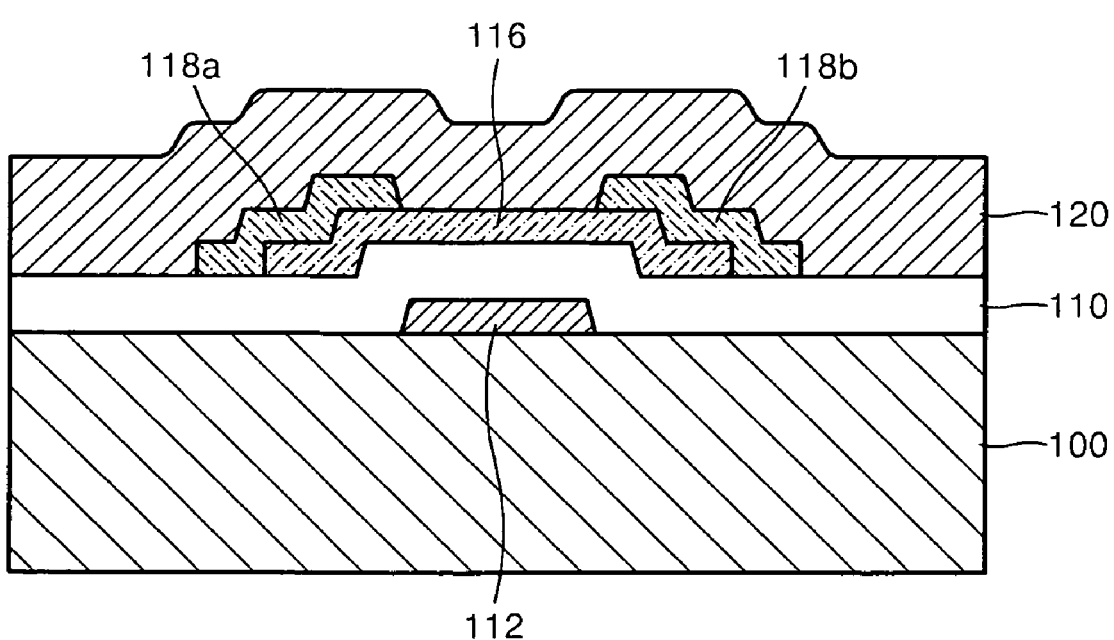

Referring to FIG. 4, the passivation layer 120 may be deposited onto the gate insulation layer 110 to cover the source and drain electrodes 118a and 118b and the channel layer 116. The passivation layer 120 may be formed of one or more of, for example, a silicon oxide film, a silicon nitride film, or an organic insulation film.

Figure 5:
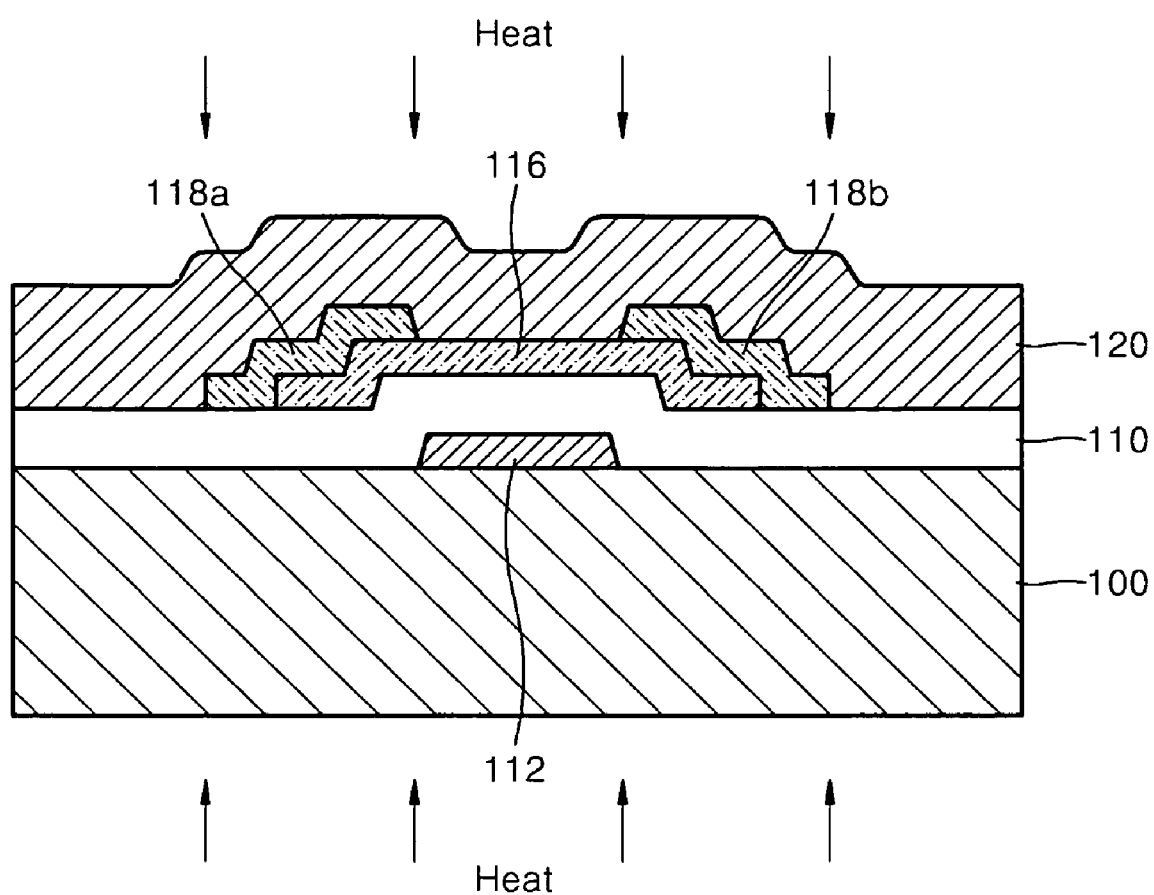

Referring to FIG. 5, an annealing process may be performed on the resultant structure of FIG. 4. In example embodiments, the annealing process may be performed for about one hour or more at a temperature of about 100° C. or above. The annealing process may be performed for about 30-100 hours at a temperature of about 200-400° C. The annealing process may be performed, for example, in an air atmosphere. However, the anneal may be performed in a variety of atmospheres, including as further examples, an oxygen or nitrogen atmosphere. As the annealing process is performed for a time that may be longer than about 1 hour in example embodiments, characteristics of the thin film transistor may be improved as will be described later.

In example embodiments, after forming the source and drain electrodes 118a and 118b and before depositing passivation layer 120, a process may be performed to supply oxygen to the upper channel region of the channel layer 116, for example a plasma process. The gas used in a plasma process may include, for example, oxygen ions. As one example, an $N_2O$ gas may be used in the plasma processing. Oxygen supplied to the upper channel region of the channel layer 116 during processing may be activated by the annealing process described above, and thus, may suppress excessive carriers generated due to lack of oxygen in the channel layer 116.

Referring to FIG. 1, when the thin film transistor is applied as a pixel portion of a display panel, the via hole 161 may be formed in the passivation layer 120 after forming the passivation layer 120 and before performing the annealing process described above. In other words, after forming the passivation layer 120, the via hole 161 may be formed in the passivation layer 120 to expose the drain electrode 118b and the annealing process as described above may be performed. After performing the annealing process, the pixel electrode 150 which is electrically connected to the drain electrode 118b, may be formed on the passivation layer 120.

Figure 6:
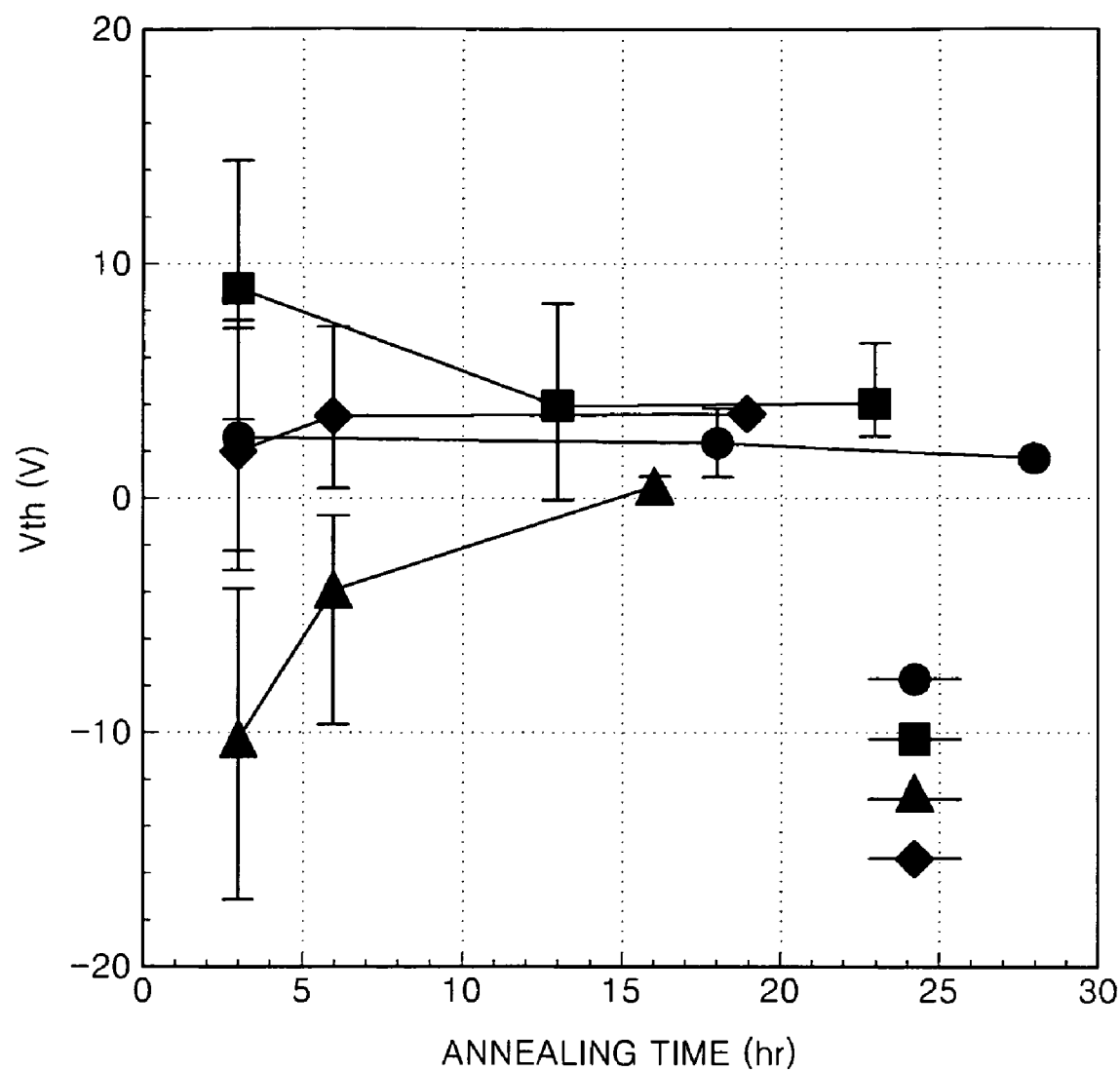

FIG. 6 is a graph showing threshold voltage as a function of anneal time for the oxide semiconductor thin film transistor of FIG. 1 according to example embodiments. FIG. 6 shows the threshold voltage $V_{th}$ as a function of anneal time of six oxide semiconductor thin film transistors selected from each of four panels (each of these panels includes a number of oxide semiconductor thin film transistors). The four panels are represented by ●, ■, ▲, and ♦ illustrated in FIG. 6, and the values obtained for the four panels are average threshold voltage values of six oxide semiconductor thin film transistor selected from each of the four panels. In example embodiments, the annealing process was performed in an air atmosphere at the temperature of about 250° C.

Referring to FIG. 6, non-uniformity for threshold voltage $V_{th}$ of the oxide semiconductors that are annealed for three hours is about 6.6 V. The non-uniformity of the threshold voltage denotes a width of variation of threshold voltages measured with respect to each panel. However, when the annealing time is about 15 hours, the non-uniformity of the threshold voltage $V_{th}$ decreases to about 0.5 V. Accordingly, as the annealing time increases, the non-uniformity for the threshold voltage of the oxide semiconductor thin film transistors gradually decreases. In addition, the difference in average threshold voltage values of the oxide semiconductor thin film transistors for the four panels decreases as the annealing time increases. For example, average threshold values for the four panels tend to converge as the annealing time is increased.

Figure 7:
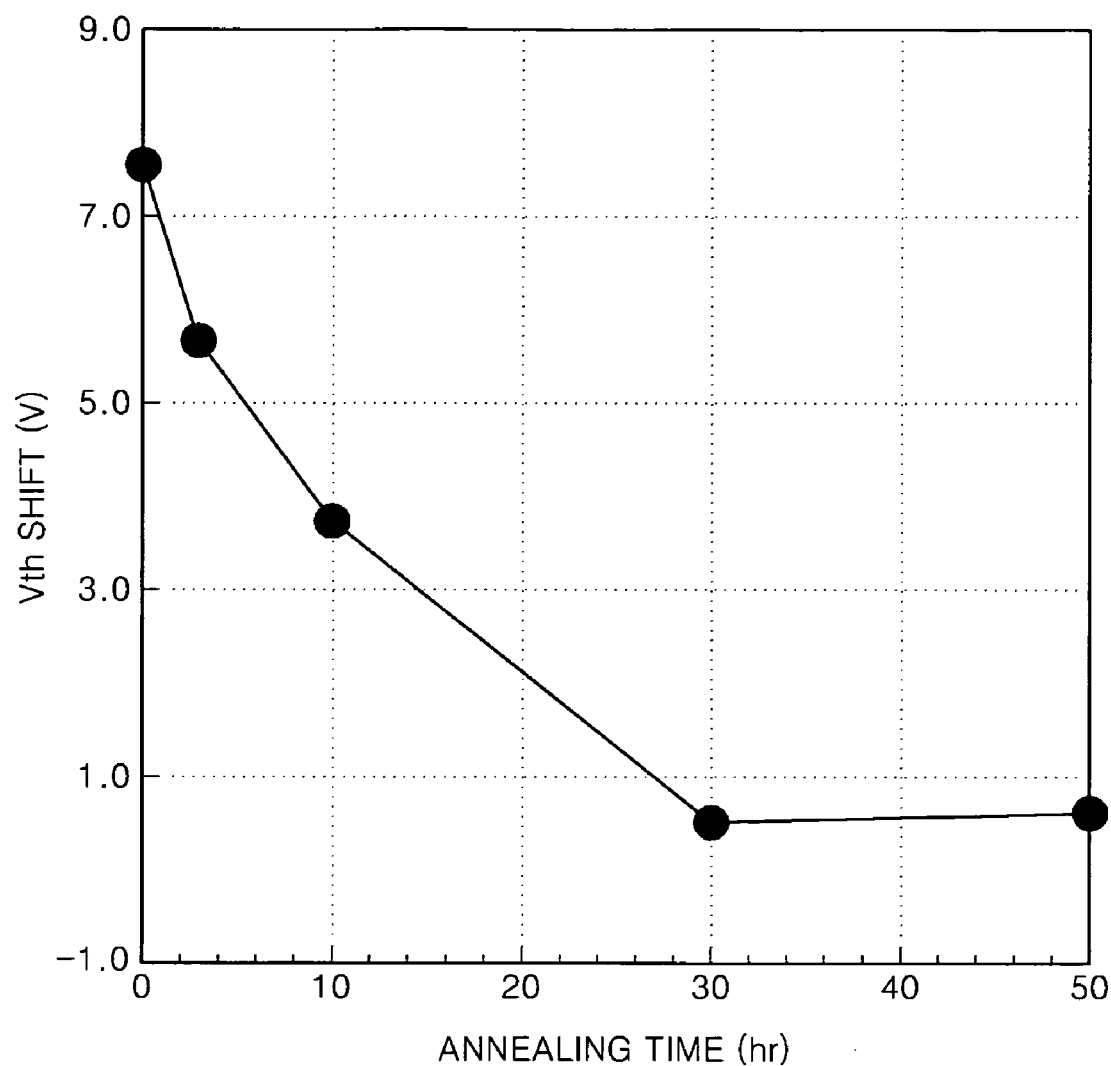

FIG. 7 is a graph showing threshold voltage shift as a function of anneal time, where the threshold voltage shift, induced by bias stress, was measured for various anneal temperatures. The bias stress was applied to the oxide semiconductor thin film transistor of FIG. 1, consisting of a 20V gate voltage and a DC voltage of 0.1 V applied between the source and drain electrodes. In this experiment, the annealing process was performed in an air atmosphere at the temperature of about 250° C.

Referring to FIG. 7, shift in the threshold voltage before the annealing process is about 8V. However, as the anneal time is increased, shift of the threshold voltage decreases so that the shift is about 0.8 V when an anneal time of about 30 hours has been applied. Accordingly, as the anneal time increases, change of the threshold voltage decreases.

Figure 8A:
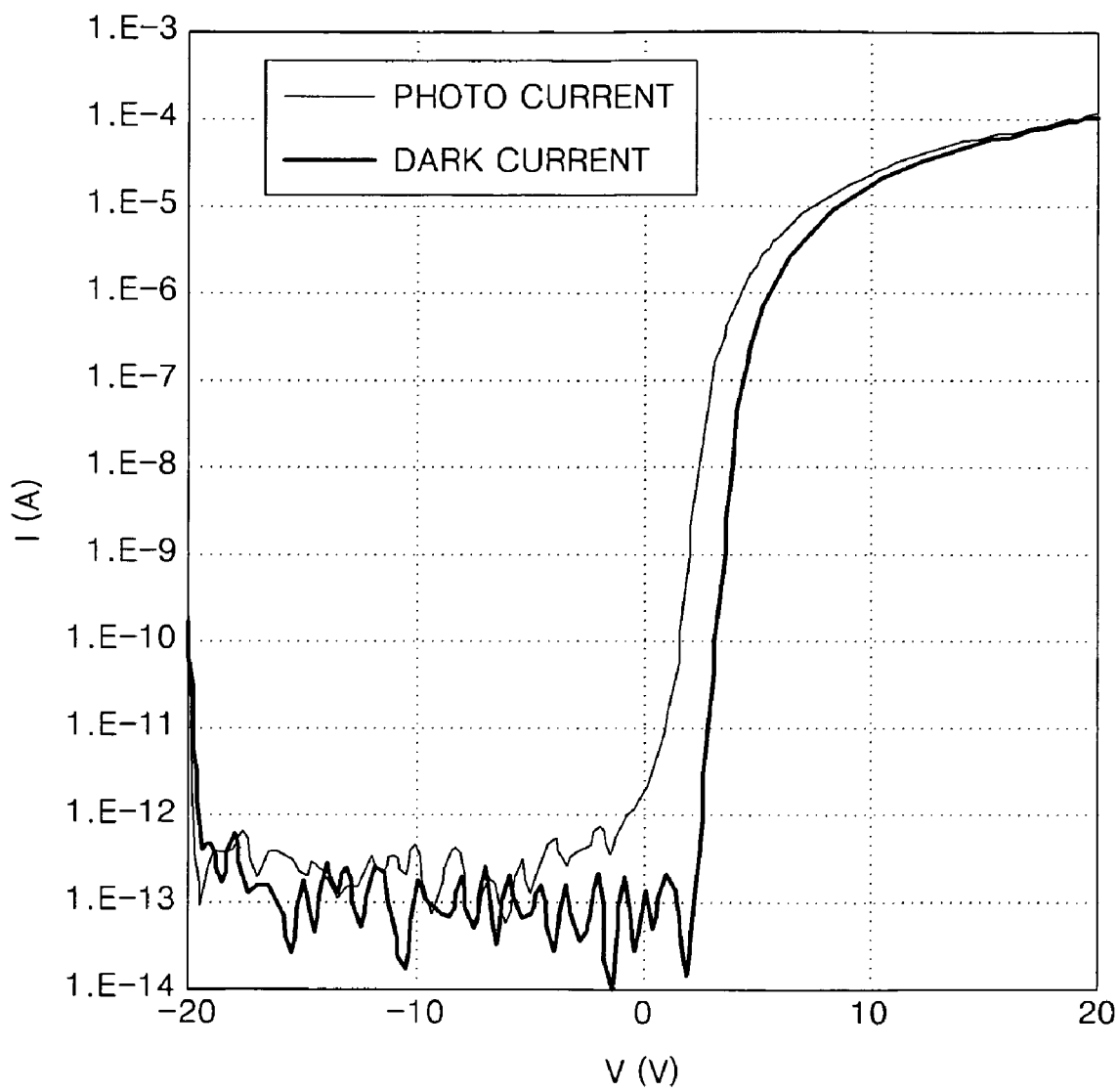
FIG. 8A is a graph showing characteristics of photo current and dark current when the oxide semiconductor thin film transistor of FIG. 1 is annealed for about one hour at a temperature of about 250° C. in an air atmosphere according to example embodiments.
Figure 8B:
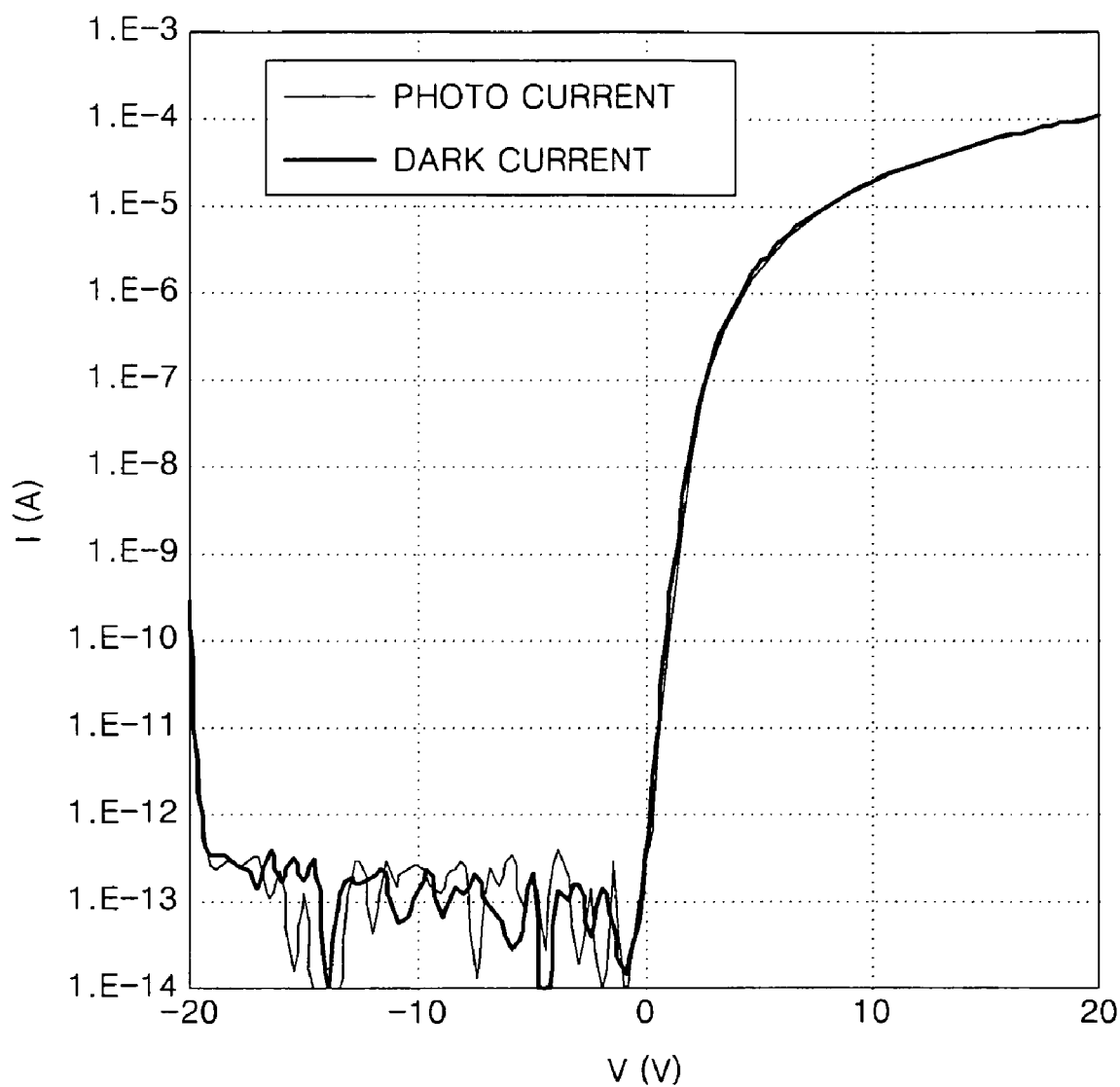
FIG. 8B is a graph showing characteristics of photo current and dark current when the oxide semiconductor thin film transistor of FIG. 1 is annealed for about 65 hours at a temperature of about 250° C. in an air atmosphere according to example embodiments.

FIG. 8A is a graph showing characteristics of photo current and dark current when the oxide semiconductor thin film transistor of FIG. 1 is annealed for about one hour at the temperature of about 250° C. in an air atmosphere. FIG. 8B is a graph showing characteristics of photo current and dark current when the oxide semiconductor thin film transistor of FIG. 1 is annealed for about 65 hours at the temperature of about 250° C. in an air atmosphere. The photo current signifies a current flowing between the source electrode and the drain electrode of the oxide semiconductor thin film transistor when irradiated by visible light. The dark current signifies a current flowing between the source electrode and the drain electrode of the oxide semiconductor thin film transistor when not irradiated by visible light. Referring to FIGS. 8A and 8B, when the oxide semiconductor thin film transistor is irradiated with visible light, photo current increases over dark current for the oxide semiconductor thin film transistor that was annealed for about 1-hour, but not for the oxide semiconductor thin film transistor annealed for about 65-hours. Accordingly, as the anneal time increases, characteristics of the oxide semiconductor thin film transistors may become progressively uniform.

Figure 9:
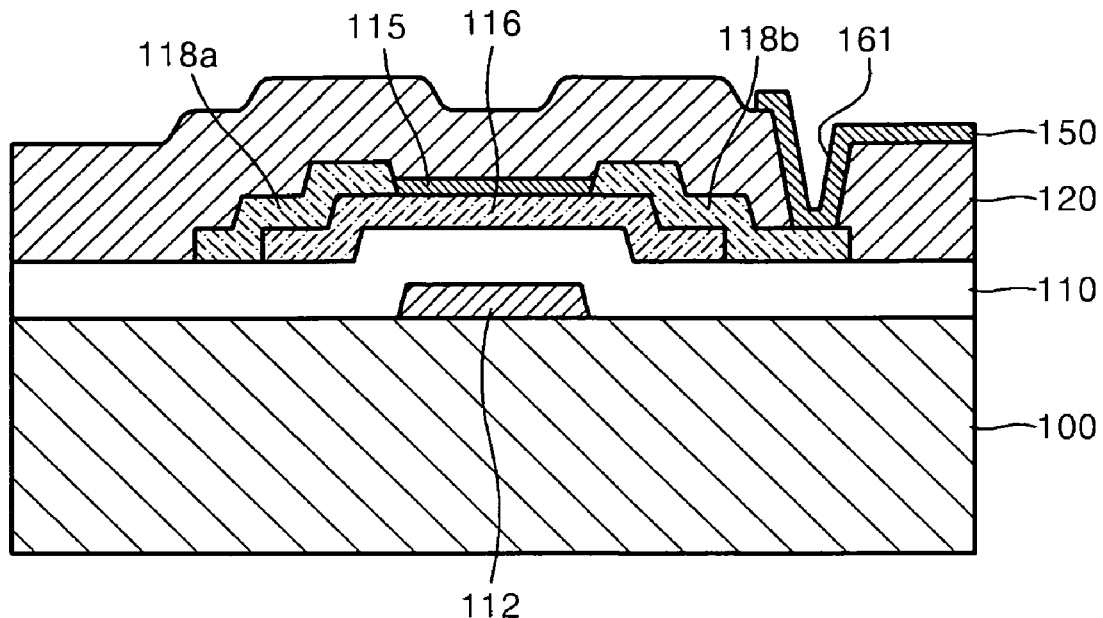

FIG. 9 is a cross-sectional diagram of an oxide semiconductor thin film transistor according to example embodiments. The oxide semiconductor thin film transistor illustrated in FIG. 9 may be the same as that illustrated in FIG. 1, except that an etch stop layer 115 may be formed between the channel layer 116 and the passivation layer 120 in FIG. 9.

Example embodiments will now be described with reference to FIG. 9. In example embodiments, manufacture of the oxide semiconductor thin film transistor of FIG. 9 may be the same as that of FIG. 1 except for forming an etch stop layer 115. In order to manufacture the oxide semiconductor thin film transistor of FIG. 9, after forming the channel layer 116 and the source and drain electrodes 118a and 118b, the etch stop layer 115 may be formed on the exposed upper surface of the channel layer 116 between the source and drain electrodes 118a and 118b.

The etch stop layer 115 may be formed of, for example, silicon oxide. The passivation layer 120 may be formed on the gate insulation layer 110 to cover the source and drain electrodes 118a and 118b and the etch stop layer 115. The annealing process may be performed for about 1 hour or more at a temperature of about 100° C. or above. For example, the annealing process may be performed for about 30-100 hours at a temperature of about 200-400° C. The annealing process may be performed, for example, in an air atmosphere. However, the anneal may be performed in a variety of atmospheres, including as further examples, an oxygen or nitrogen atmosphere.

Figure 10:
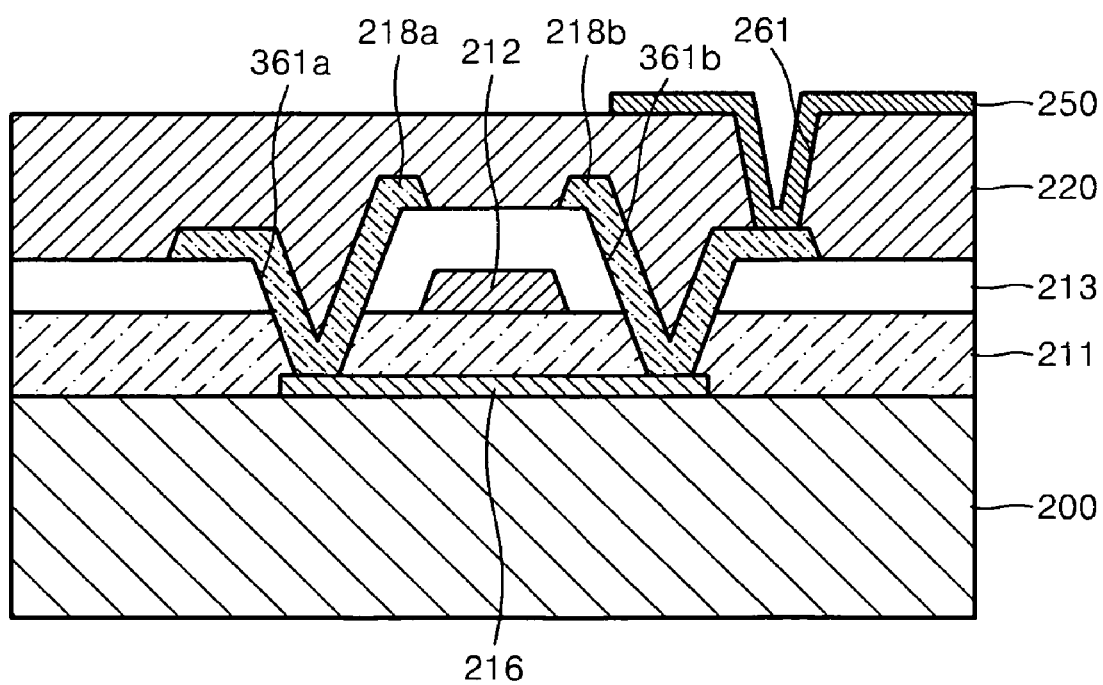

FIG. 10 is a cross-sectional diagram of an oxide semiconductor thin film transistor according to example embodiments. Unlike the thin film transistor of FIG. 1, the thin film transistor of FIG. 10 may have a top gate structure. Hereinafter, manufacture of the oxide semiconductor thin film transistor of FIG. 10 is described, for the most part, based on the differences from those of embodiments described above.

Example embodiments will now be described with reference to FIG. 10. In example embodiments, a channel layer 216 formed of a transparent oxide semiconductor may be formed on a substrate 200 and a gate insulation layer 211 may be formed on the substrate 200 to cover the channel layer 216. Materials for forming the transparent oxide semiconductor may include one or more of, for example, Zinc Oxide, Tin Oxide, Ga—In—Zn Oxide, In—Zn Oxide, In—Sn Oxide, and one of these materials doped with Al, Ni, Cu, Ta, Hf, or Ti. A gate 212 may be formed on the gate insulation layer 211 to correspond to the channel layer 216 and a inter-layer dielectric (ILD) layer 213 may be formed on the gate insulation layer 211 to cover the gate 212. First via holes 361a and 361b may be formed in the ILD layer 213 and the gate insulation layer 211 for forming source and drain electrodes 218a and 218b.

Portions of both ends of the channel layer 216 may be exposed through the first via holes 361a and 361b. The source and drain electrodes 218a and 218b may be formed on the ILD layer 213 to connect to the channel layer 216 through the first via holes 361a and 361b. A passivation layer 220 may be formed to cover the source and drain electrodes 218a and 218b and the ILD layer 213 and an annealing process may be performed. The annealing process may be performed for about one hour or more at a temperature of about 100° C. or above. For example, the annealing process may be performed for about 30-100 hours at a temperature of about 200-400° C. The annealing process may be performed, for example, in an air atmosphere. However, the anneal may be performed in a variety of atmospheres, including as further examples, an oxygen or nitrogen atmosphere.

When the thin film transistor is applied as a pixel portion of a display panel, forming a second via hole 261 may be formed in the passivation layer 120 for forming a pixel electrode 250 after forming the passivation layer 220 and before performing the annealing process described above. In other words, after forming the passivation layer 220, the second via hole 261 may be formed in the passivation layer 120 to expose the drain electrode 218b after which the annealing process may occur. For example, the annealing process may be performed for about 30-100 hours at a temperature of about 200-400° C. After performing the annealing process, the pixel electrode 250 which is electrically connected to the drain electrode 218b may be formed on the passivation layer 220.

Although example embodiments have been shown and described in this specification and figures, it will be understood by those of ordinary skill in the art that various changes may be made to the illustrated and/or described embodiments without departing from their principles and spirit, the scope of which is defined by the claims.

What is claimed is:

1. A method of manufacturing oxide semiconductor thin film transistors, comprising:
   forming a gate on a substrate;
   forming a gate insulation layer on the substrate to cover the gate;
   forming a channel layer of transparent oxide semiconductor on the gate insulation layer;
   forming source and drain electrodes on both sides of the channel layer;
   performing a process step for supplying oxygen to the channel layer, after the forming of the source and drain electrodes;
   forming a passivation layer on the channel layer, the forming of the passivation layer including forming the passivation layer to cover the source and drain electrodes; and
   performing an annealing process for about one hour or more at a temperature of about 100° C. or above.

2. The method of claim 1, wherein the annealing process is performed for about 30-100 hours at a temperature of about 200-400° C.

3. The method of claim 1, wherein the annealing process is performed in an air, oxygen, or nitrogen atmosphere.

4. The method of claim 1, wherein the transparent oxide semiconductor comprises one or more of Zinc Oxide, Tin Oxide, Ga—In—Zn Oxide, In—Zn Oxide, In—Sn Oxide, and one of these materials doped with Al, Ni, Cu, Ta, Hf, or Ti.

5. The method of claim 1, wherein the passivation layer is formed of one or more of a silicon nitride film, silicon oxide film, and an organic insulation film.

6. The method of claim 1, further comprising: forming an etch stop layer between the channel layer and the passivation layer.

7. The method of claim 6, wherein the etch stop layer is formed of silicon oxide.

8. A method of manufacturing an oxide semiconductor thin film transistor, comprising:
   forming a channel layer of transparent oxide semiconductor on a substrate;

forming a gate insulation layer on the substrate to cover the channel layer;

forming a gate on the gate insulation layer;

forming an ILD layer on the gate insulation layer to cover the gate;

performing an annealing process for about one hour or more at a temperature of about 100° C. or above, forming source and drain electrodes to connect to portions of both ends of the channel layer on the ILD layer;

performing a process step for supplying oxygen to the channel layer, after the forming of the source and drain electrodes; and forming a passivation layer on the inter-layer dielectric (ILD) layer to cover the source and drain electrodes.

9. The method of claim 8, wherein the annealing process is performed for about 30-100 hours at a temperature of about 200-400° C.

10. The method of claim 8, wherein the annealing process is performed in an air, oxygen, or nitrogen atmosphere.

11. The method of claim 8, wherein the transparent oxide semiconductor comprises one or more of Zinc Oxide, Tin Oxide, Ga—In—Zn Oxide, In—Zn Oxide, In—Sn Oxide, and one of these materials doped with Al, Ni, Cu, Ta, Hf, or Ti.

12. The method of claim 8, wherein the passivation layer is formed of one or more of a silicon nitride film, silicon oxide film, and an organic insulation film.

13. The method of claim 8, further comprising:

forming a via hole in the ILD layer and the gate insulation layer for forming the source and drain electrodes after forming the ILD layer.

* * * * *